United States Patent
Ghoneim et al.

(10) Patent No.: US 11,295,963 B2
(45) Date of Patent: Apr. 5, 2022

(54) MICROFABRICATION TECHNIQUES AND DEVICES FOR THERMAL MANAGEMENT OF ELECTRONIC DEVICES

(71) Applicant: KING ABDULLAH UNIVERSITY OF SCIENCE AND TECHNOLOGY, Thuwal (SA)

(72) Inventors: Mohamed Tarek Ghoneim, Mohandessin (EG); Muhammad Mustafa Hussain, Austin, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 353 days.

(21) Appl. No.: 16/340,487

(22) PCT Filed: Oct. 4, 2017

(86) PCT No.: PCT/IB2017/056127
§ 371 (c)(1),
(2) Date: Apr. 9, 2019

(87) PCT Pub. No.: WO2018/087612
PCT Pub. Date: May 17, 2018

(65) Prior Publication Data
US 2019/0244832 A1    Aug. 8, 2019

Related U.S. Application Data

(60) Provisional application No. 62/421,498, filed on Nov. 14, 2016.

(51) Int. Cl.
*H01L 21/48* (2006.01)
*H01L 21/762* (2006.01)
(Continued)

(52) U.S. Cl.
CPC ........ *H01L 21/4871* (2013.01); *F28F 21/089* (2013.01); *H01L 21/762* (2013.01); *H01L 23/3672* (2013.01); *H01L 23/3736* (2013.01)

(58) Field of Classification Search
CPC ............ H01L 21/4871; H01L 21/3081; H01L 21/0272; H01L 21/0331; H01L 21/4882;
(Continued)

(56) References Cited

U.S. PATENT DOCUMENTS 5,872,396 A * 2/1999 Kosaki .................... H01L 21/78
257/712
9,245,798 B2 * 1/2016 Emesh ............. H01L 21/76882
(Continued)

FOREIGN PATENT DOCUMENTS

EP    1796138        *  6/2007 ................ F28F 3/12
EP    1796138 A2       6/2007
(Continued)

OTHER PUBLICATIONS

English Translation of EP1796138 (Year: 2007).*
(Continued)

*Primary Examiner* — Zachary Pape
*Assistant Examiner* — Amir A Jalali
(74) *Attorney, Agent, or Firm* — Patent Portfolio Builders PLLC

(57) ABSTRACT

A method of fabricating a thermal management device. The method includes depositing a seed layer, using a seed layer depositing technique, on a side of a support base; growing a heat sink base layer on a side of the seed layer; depositing a hard mask on a side of the support base directly opposite that containing the seed and heat sink base layers; patterning the hard mask with a photoresist mask; etching the patterned hard mask with an etching technique, wherein the etching creates trenches in the underlying support base, exposing the
(Continued)

seed layer; removing the hard mask with a hard mask removal technique; depositing a layer of photoresist on the heat sink base layer; growing heat sinks using a heat sink growth technique on the exposed seed layer; removing the photoresist layer with a photoresist layer removal technique; and removing the support base with a support base removal technique.

16 Claims, 6 Drawing Sheets

(51) Int. Cl.
*H01L 23/373* (2006.01)
*H01L 23/367* (2006.01)
*F28F 21/08* (2006.01)

(58) Field of Classification Search
CPC . H01L 21/762; H01L 21/76898; H01L 21/56; H01L 23/3672; H01L 23/3677; H01L 23/3737; H01L 23/3736; H01L 23/367; H01L 23/373; H01L 23/42; H01L 2224/16225; H01L 2224/73253; H01L 2924/0002; H01L 2924/00
See application file for complete search history.

(56) References Cited

U.S. PATENT DOCUMENTS

| | | | | |
|---|---|---|---|---|
| 9,425,108 | B1* | 8/2016 | Pranatharthiharan | H01L 29/0642 |
| 9,496,371 | B1* | 11/2016 | Arndt | H01L 21/3081 |
| 9,704,751 | B1* | 7/2017 | Chang | H01L 21/823821 |
| 2006/0134831 | A1* | 6/2006 | Cohen | C25D 1/003 438/108 |
| 2008/0038874 | A1* | 2/2008 | Lin | H01L 24/11 438/118 |
| 2009/0101972 | A1* | 4/2009 | Gaines | H01L 27/1203 257/335 |
| 2012/0306082 | A1* | 12/2012 | Sekar | H01L 27/12 257/758 |
| 2015/0072527 | A1* | 3/2015 | Ng | H01L 21/0338 438/696 |
| 2016/0324002 | A1* | 11/2016 | Tazarine | H05K 1/181 |
| 2018/0076202 | A1* | 3/2018 | Basker | H01L 21/823821 |
| 2019/0109063 | A1* | 4/2019 | Chew | H01L 23/48 |

FOREIGN PATENT DOCUMENTS

| | | | |
|---|---|---|---|
| EP | 1796165 A2 | 6/2007 | |
| FR | 2984008 A1 * | 6/2013 | H01L 23/24 |
| JP | 2003332503 A | 11/2003 | |
| JP | 2004179540 A | 6/2004 | |
| KR | 20110115304 A | 10/2011 | |
| WO | 2005029572 A1 | 3/2005 | |

OTHER PUBLICATIONS

English Translation of FR 2984008, Haykel, (Year: 2013).*
International Search Report in corresponding/related International Application No. PCT/IB2017/056127, dated Jan. 11, 2018.
Written Opinion of the International Searching Authority in corresponding/related International Application No. PCT/IB2017/056127, dated Jan. 11, 2018.

* cited by examiner

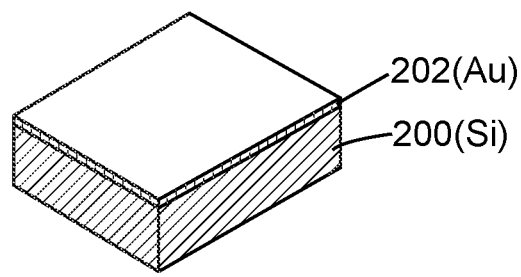
FIG. 3a
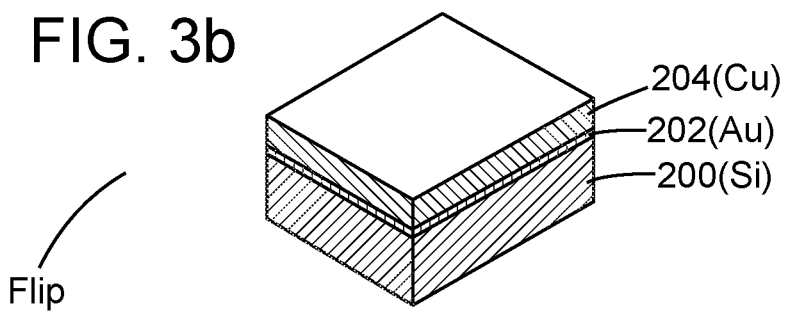
FIG. 3b
FIG. 3c
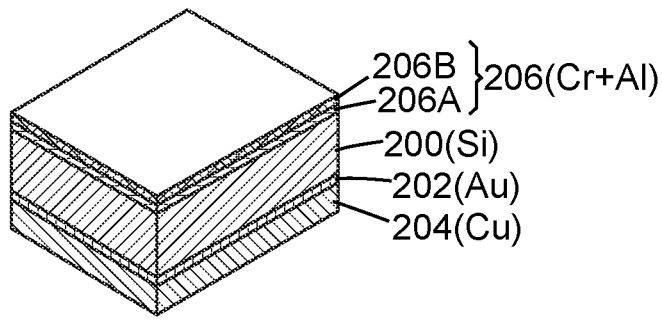
FIG. 3d
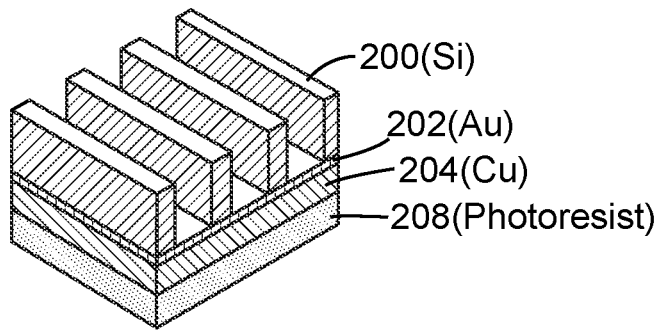
FIG. 3e
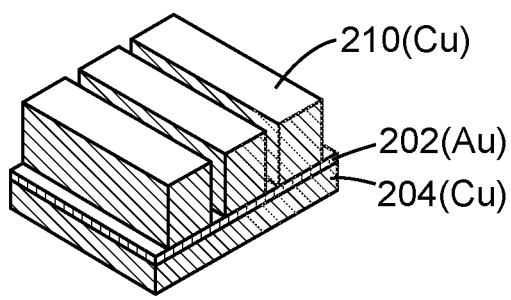

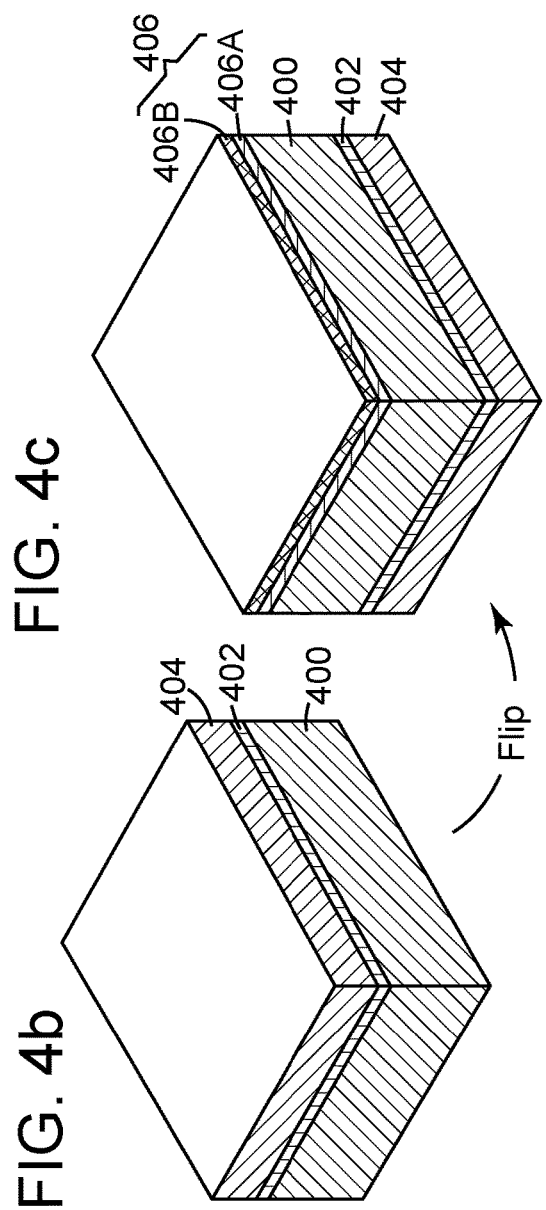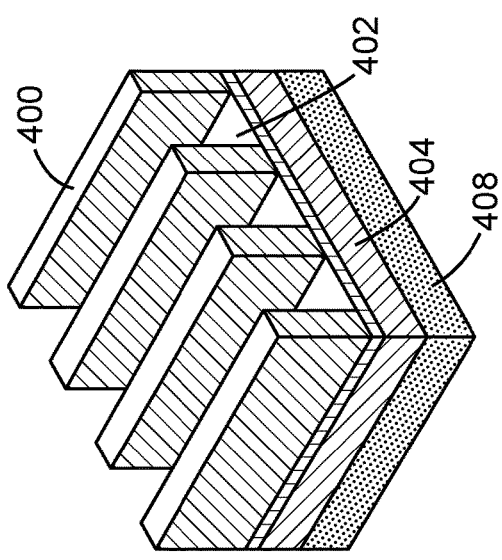

MICROFABRICATION TECHNIQUES AND DEVICES FOR THERMAL MANAGEMENT OF ELECTRONIC DEVICES

CROSS-REFERENCE TO RELATED APPLICATIONS

This application is a U.S. National Stage Application of International Application No. PCT/2017/056127, filed on Oct. 4, 2017, which claims priority and benefit from U.S. Provisional Application No. 62/421,498, filed Nov. 14, 2016, the entire contents of which are incorporated herein by reference.

TECHNICAL FIELD

The present disclosure generally relates to thermal management of electronic devices, for example Internet of Things (IoT) devices.

BACKGROUND

The future of electronics implementing the concept of Internet of Things (IoT) holds promise for a better connected world, a flow of useful statics from big data analysis, and eventually, positively affecting the quality of peoples' lives. The IoT concept envisions electronic devices and sensors that are very similar to today's electronics, with a few key changes. These key changes lie in wiring, power management, and heat dissipation. These changes are all entangled. For instance, the absence of wires in the IoT vision necessitates the presence of transceiver units, and batteries to supply power. Sending information, between connected devices for example, is also a power hungry process that increases the battery discharging rate. In addition, the consumed power results in waste heat energy from the heating up electronic devices. This generated heat, if not dissipated properly, detrimentally affects the electronic circuitry in terms of further draining the battery through increased leakage and the overall reliability of the chip through thermal runaway failures. Therefore, heat management and cooling of electronic devices, IoT devices in particular, is a major challenge. Historically, this has been performed through bulky heat sinks that are not suitable for the low weight, small sized, portable, and flexible IoT devices. Accordingly, there is a need to address the aforementioned deficiencies and inadequacies.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 3(a)-3(e) depicts materials that can be used in an embodiment of the present disclosure in microfabrication of a thermal management device.

FIG. 4(a) shows a first step of an embodiment of microfabrication of a micro-scale thermal management device wherein a gold (Au) seed layer is sputtered on a silicon (Si) base.

FIG. 4(b) shows a second step of an embodiment of microfabrication of a micro-scale thermal management device wherein a copper (Cu) heat sink base layer is deposited on the Au seed layer on a side opposite that the Si base.

FIG. 4(c) shows a third step of an embodiment of microfabrication of a micro-scale thermal management device wherein the device in manufacture is flipped, and a hard mask comprising aluminum (Al) and chromium (Cr) is sputtered on the Si base on a side opposite that the seed layer and heat sink base layer as shown.

FIG. 4(d) shows a fourth step of an embodiment of microfabrication of a micro-scale thermal management device wherein the hard mask is masked, the hard mask is patterned, the device is etched, the hard mask is removed, and then a photoresist or photoresist layer is added to the heat sink base layer on a side opposite the Au seed layer.

FIG. 4(e) shows a fifth step of an embodiment of microfabrication of a micro-scale thermal management device wherein Cu heat sinks are deposited on the device on the exposed seed layer, the photoresist or photoresist layer on the heat sink base layer is removed, and the remaining Si is removed by etching in an $XeF_2$ reactor.

DETAILED DESCRIPTION

Figure 1:
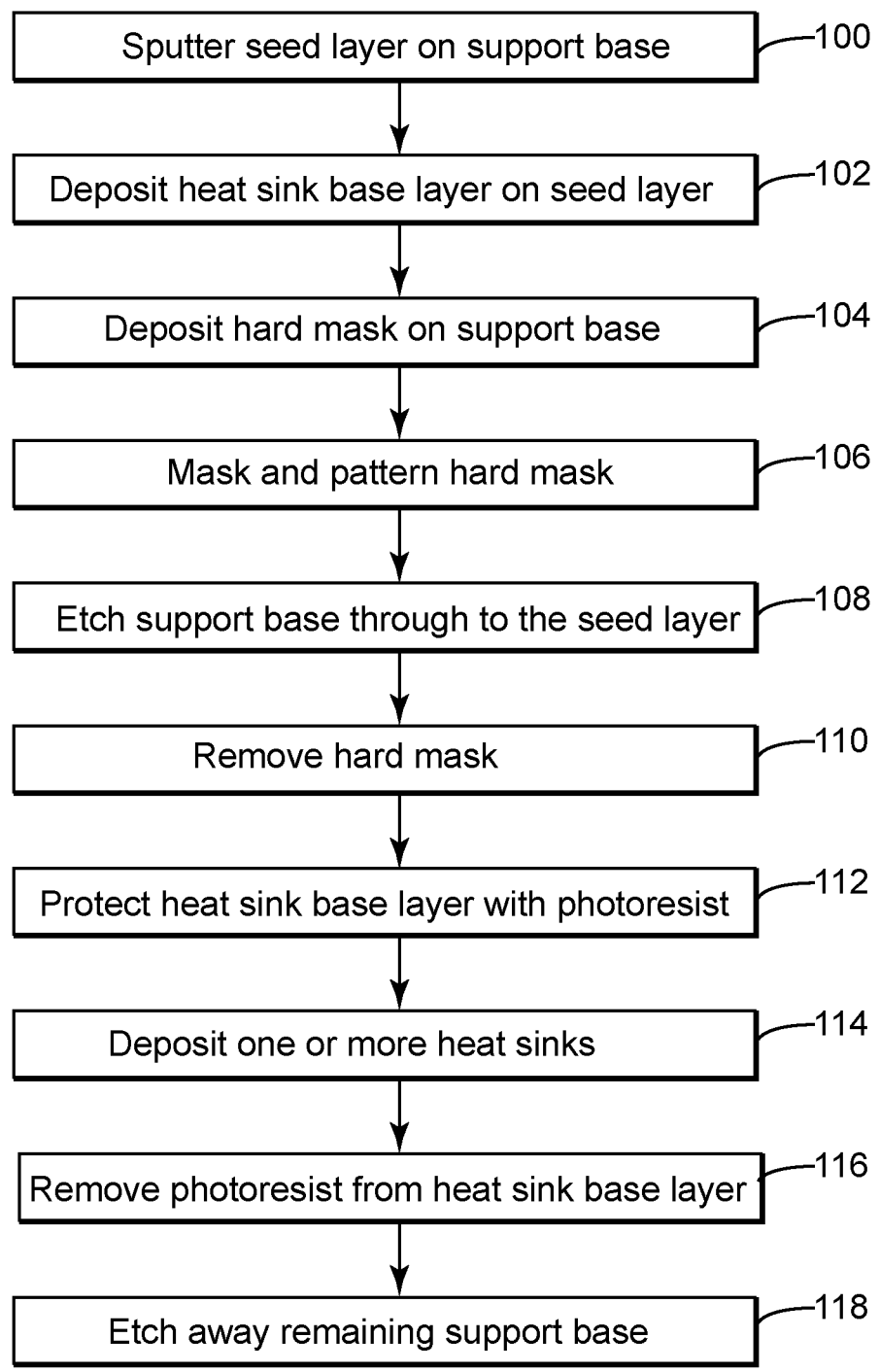
FIG. 1 is a flowchart depicting steps of microfabrication of a thermal management device according to an embodiment of the present disclosure.

Described below are various embodiments of the present systems and methods for thermal management of electronic devices, especially IoT devices. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, materials science, manufacturing, semiconductor manufacturing, heat dissipation and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

The present disclosure is directed to devices for thermal management of electronic devices, especially IoT devices, and methods of fabrication. Described herein are thermal management devices that allow for efficient dissipation of waste heat in electronic devices and in IoT devices, and methods of fabrication of said thermal management devices.

Thermal management challenges relating to electronic devices and IoT devices can be summarized in two main steps: (1) extracting the heat from the source (electronic devices), and (2) dissipating the extracted heat to the environment. Historically, thermal management has been performed through bulky heat sinks that are not suitable for the low weight, small-sized, portable, and flexible electronic devices and IoT devices of today. Current alternative solutions utilizing water cooling are still bulky, inflexible, heavy in weight, and susceptible to other issues, such as leakage for example. Recent works on novel materials with high thermal conductivity solve the first heat extraction issue but still does not address the second step pertaining to dissipating the heat away from the device into the surrounding environment. Described herein are micro-fabrication based methods for thermal management suitable for electronic devices, IoT devices, and next generation IoT devices. FIG. 1 depicts a flow chart for an embodiment of a microfabrication technique that can be used to fabricate a micro-scale thermal management device. The method shown in FIG. 1 includes a step 100 of sputtering seed layers on support base; a step 102 of depositing heat sink base layer on seed layer; a step 104 of depositing hard mask on support base; a step 106 of masking and patterning hard mask; a step 108 of etching support base through to the seed layer; a step 110 of removing hard mask; a step 112 of protecting heat sink base layer with photoresist; a step 114 of depositing one or more heat sinks; a step 116 of removing photoresist from heat sink base layer and a step 118 of etching away remaining support base.

A technique for generating thermal management devices for electronics and IoT devices can be a microfabrication technique as described herein. A support base can be used as a starting point for fabrication. As used herein, a support base can be a support, support mold, wafer, or the like. A support base can be made of silicon. In an embodiment, a silicon base can be a silicon wafer that has a thickness of about 500 μm. Silicon wafers of other sizes can be used, such as an 8-inch wafer with a thickness of about 1.1 mm. Other arbitrary host substrates can be used to integrate the microfabricated heat dissipation structures along various devices and material systems such as III-V materials with laser diodes and power hungry devices. Also, the thickness of the support base substrate can vary depending on the material and the lateral dimensions of commercially available wafers and the desired properties of the resultant device (for instance, Si wafers can be 200 μm thick for 2 inch wafer and 1.1 mm thick for 8 inch wafers).

Figure 2A:
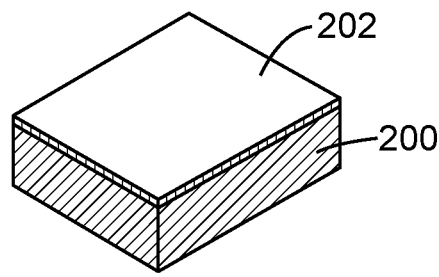
FIGS. 2(a)-2(e) is a graphical depiction of microfabrication of a thermal management device according to an embodiment of the present disclosure.

A seed layer 202, such as a seed layer of gold (Au), can be deposited onto a side of the Si base 200 (FIG. 2(a), FIG. 3(a)). The seed layer 202 can be a flexible seed layer and can maintain function with a non-planar structure. Suitable materials for seed layers are good thermal conductive materials and metals suitable for electrochemical deposition. The seed layer can be deposited by various deposition methods including physical and chemical depositions. For example, Cu can be evaporated, or sputtered or deposited by chemical vapor deposition (CVD) or atomic layer deposition (ALD). In an embodiment, the thickness of the seed layer should suffice to completely cover the surface of the substrate for uniform structure growth everywhere and continuity. A reasonable thickness of a gold seed layer deposited on a silicon wafer with surface roughness of few nano meters is 50 nm Gold film.

Figure 2B:
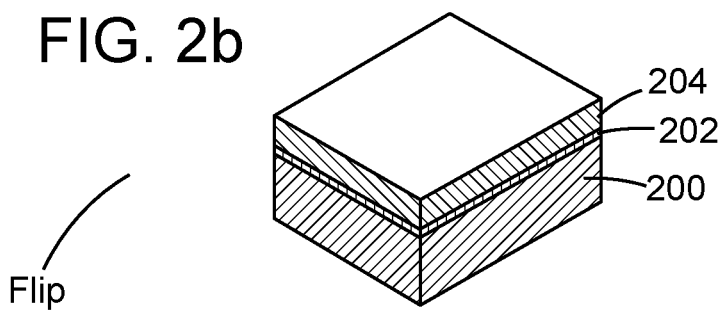

After deposition of the seed layer 202, a heat sink base layer can be deposited onto the seed layer 202 side opposite the support base 204. As used herein, a heat sink base can be a heat sink base layer and vice versa. The heat sink base layer can be a layer of copper (Cu) or a Cu composition (Cu in combination with other elements, alloys, or compositions) that can be deposited with a deposition technique such as electrochemical deposition (ECD) or other suitable physical or chemical techniques onto the seed layer 202 (FIG. 2(b), FIG. 3(b)). Other techniques and seed layers can be used. In an embodiment, the seed layer 202 is gold and the heat sink base layer 204 is copper, and the copper is deposited via ECD. In an embodiment, the resulting Cu layer can be about 10 μm thick. The seed layer can be thicker and can increase the reliability of the structure for handling, but as thickness increases, flexibility can decrease. This is a trade-off that can be tailored by one skilled in the art based on the desired application. The flexural modulus generally can be inversely proportional to the thickness cubed ($E_{Flexural} \propto 1/t^3$). However, even for a material that is not naturally ductile as silicon, it can bend up to 0.5 cm bending radius at a thickness of 10 μm. In an embodiment, the heat sink base layer can be a flexible layer to promote attachment of resultant devices to non-planar surfaces.

Figure 2C:
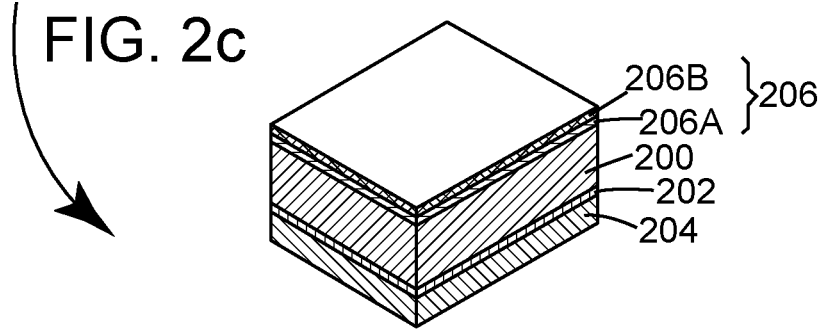

Following deposition of the heat sink base layer 204, the device in microfabrication can be flipped, and a hard mask 206 can be sputtered onto the support base 200, on the side of the support base opposite the seed layer 202 and heat sink base layer 204 (FIG. 2(c), FIG. 3(c)). A hard mask 206 can be comprised of two layers. The first layer can be an aluminum (Al) layer 206A deposited onto the support base 200. The Al layer 206A can have a thickness of about 300 nm. The second layer 206B can be deposited onto the first Al layer 206A, can be comprised of chromium (Cr), and can have a thickness of about 150 nm. Hard masks 206 can be any material with good selectivity to when etching silicon (i.e. oxides, photoresist, metals, and others). They can be deposited by chemical or physical deposition techniques as necessary, including ALD, CVD, sputtering, evaporation, and sol-gel coating. Thicknesses and material systems are versatile and can be chosen by one skilled in the art to meet the desired application requirements in terms of flexibility, cost, environmental impact, and compatibility with other materials in the system.

Figure 2D:
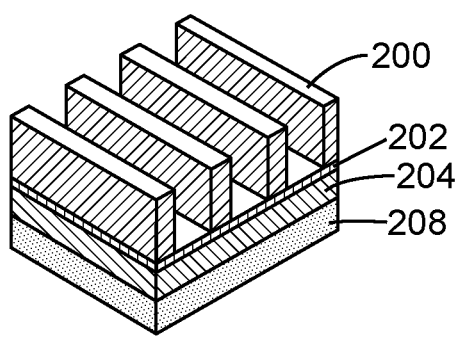
Figure 2E:
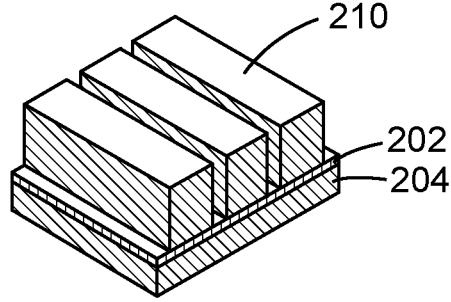
Figure 5:
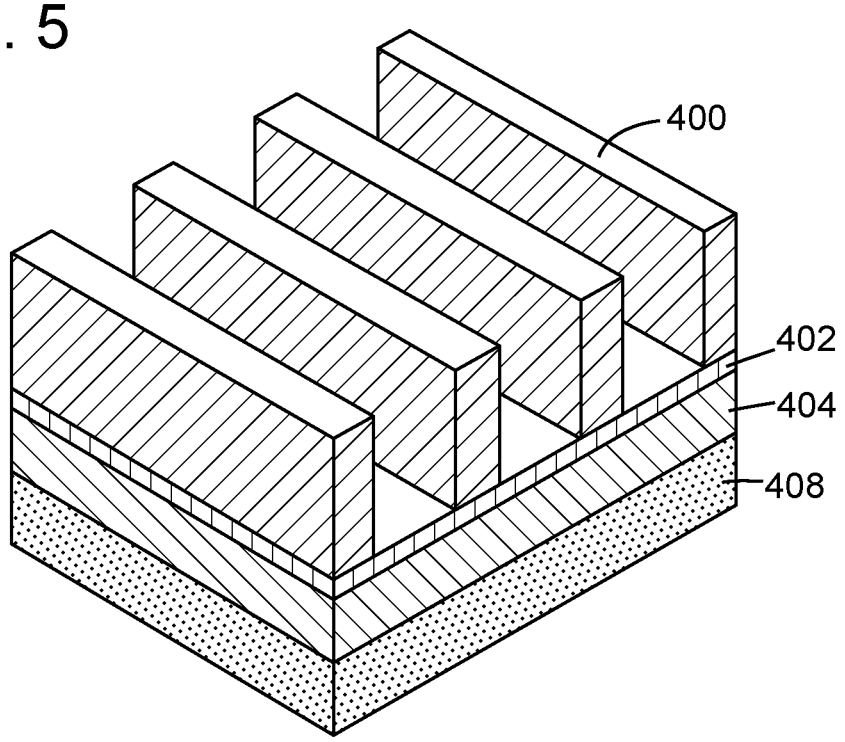
FIG. 5 shows an embodiment of a non-complete thermal management device during microfabrication after hard mask patterning and silicon etching. The gaps in the silicon where the seed layer is exposed can be used for heat sink growth.

The hard mask 206 can then be masked with a photoresist, such as ECI 3027 photoresist for example, and patterned using standard photolithography techniques (FIG. 2(d), FIG. 3(d)). Examples of patterning are shown in FIG. 2 and FIG. 3, and embodiments are further elucidated in FIG. 5 and FIG. 6. After the hard mask is patterned, the underlying support base 200 can be etched using deep reactive ion etching, or other suitable techniques. Other suitable techniques can be techniques such as the Bosch process, cryogenic etching, traditional reactive ion etching (RIE), or, in case spherical or non-flat features are required, isotropic etchants such as Xenon Diflouride ($XeF_2$). Etching can be carried out until the hard mask 206 is gone from the desired patterned area and the underlying seed layer 202 is exposed (FIG. 2(d), FIG. 3(d)). After etching, the side of the heat sink base layer 204 opposite the seed layer can be coated and protected with a photoresist 208 or layer of photoresist 208 (FIG. 2(d), FIG. 3(d)). The hard mask 206 can be removed using solvents such as Acetone or chemical developers which dissolve most polymers, including photoresists.

After the heat sink base layer 204 is protected with photoresist 208, heat sinks 210 are then grown on the seed layer 202 where the support base was etched. The heat sinks 210 can be Cu and can be grown with a technique such as ECD or other suitable techniques (FIG. 2(e), FIG. 3(e)).

Following heat sink deposition, the photoresist layer 208 on the heat sink base layer 204 can be removed by a suitable technique, immersion in a solvent (such as Acetone) bath for example. After the photoresist layer 208 on the heat sink base layer 204 is removed, the remaining support base can be removed by placing the resulting device in a reactor, such as a $XeF_2$ reactor (FIG. 2(d), FIG. 3(d)). Alternatively the Si can be removed using wet Etchants (Such as Potassium Hydroxide (KOH)) or DRIE, Bosch process, or Cryogenic etching (with the caveat that the etchant has to have good selectivity to the other materials in the system) FIGS. 3(a)-3(e) show examples of materials that can be used for the microfabrication steps as described herein.

From the previously described microfabrication techniques, one or more thermal management devices can be created that have micro-scale features which maximize surface area with minimum vertical height, and have a very thin base to attain and promote flexibility of the thermal management device. These thermal management devices are described herein can act as stand-alone micro-fabricated flexible heat sinks and can be attached to substrates of varied compositions, such as electronic chips, through a thermal interface layer, such as thin thermal grease or graphite composites, for thermal management of electronic devices, IoT devices in particular.

Thermal management devices as described herein can be flexible, and the substrate to which they are attached need not be planar as the design of the thermal management devices as described herein promotes flexibility of the devices and their attachment to a variety of substrate shapes, surfaces, and/or surface shapes. One skilled in the art would be able to select a thermal interface layer appropriate for attachment of a thermal management device according to the present disclosure based on properties such as composition and/or shape of the substrate to which the thermal management device is to be attached.

One or more thermal management devices as described herein can be attached to one or more electronic chips. The number of thermal management devices (one or more) described herein attached to an electronic chip can be scaled up or down (down only if more than one device is attached) according to the specific thermal management needs of the specific electronic chip to which one or more thermal management devices are attached.

EXAMPLES

Example 1

Figure 6:
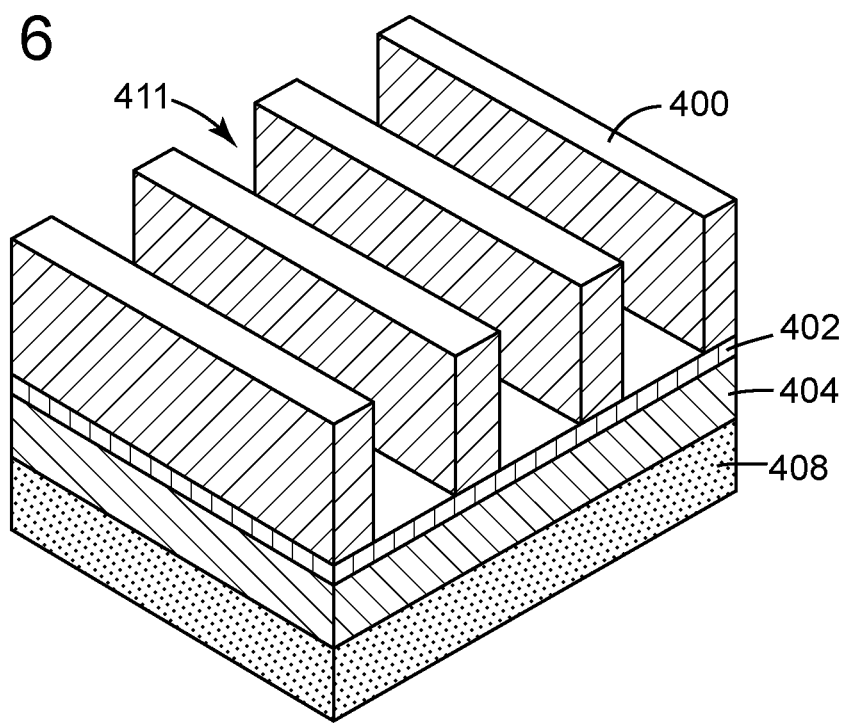
FIG. 6 shows an embodiment of a non-complete thermal management device during microfabrication after hard mask patterning and silicon etching. The gaps in the silicon where the seed layer is exposed in this embodiment are referred to as "trenches" which can be used for heat sink growth.

FIGS. 4(a)-4(e) demonstrate an embodiment of a microfabricated, flexible, light weight, suitable for IoT heat sink and method of fabrication. First, a gold (Au) seed layer 402 can be deposited on a 500 μm thick Silicon wafer 400 (FIG. 4(a)). In the present example, the silicon wafer 400 is a support base and the phrases Silicon wafer, Si base, and support base are interchangeable. Next, electrochemical deposition (ECD) can be used to grow a heat sink base layer 404 (a layer Cu with 10 μm thickness) on a side of the Au seed layer 402 opposite the Si base 400 (FIG. 4(b)). On the side of the Si wafer 400 opposite the side containing the Au seed layer 402 and Cu heat sink base layer 404, a hard mask 406 of 300 nm aluminum (Al) 406A and 150 nm of Chromium (Cr) 406B can be deposited (FIG. 4(c)) then patterned using regular photolithographic techniques and positive ECI 3027 photoresist (PR) to open trenches for heat sink growth (FIG. 4(d)). Then using the patterned hard mask, silicon can be etched using deep reactive ion etching or other suitable techniques until it is totally gone from the trenches and Au seed layer 402 is exposed (FIG. 4(d)). Then the back side can be coated with a photoresist or photoresist layer 408 to prevent copper growth on the Cu heat sink base layer 404 (FIG. 4(d)). Embodiments of the device during microfabrication after patterning, etching, and application of the photoresist or photoresist layer can be seen in FIG. 5 and FIG. 6. FIG. 6 depicts an embodiment of the present disclosure showing "trenches" 411 etched into the Si base where heat sinks can be deposited.

Figure 7:
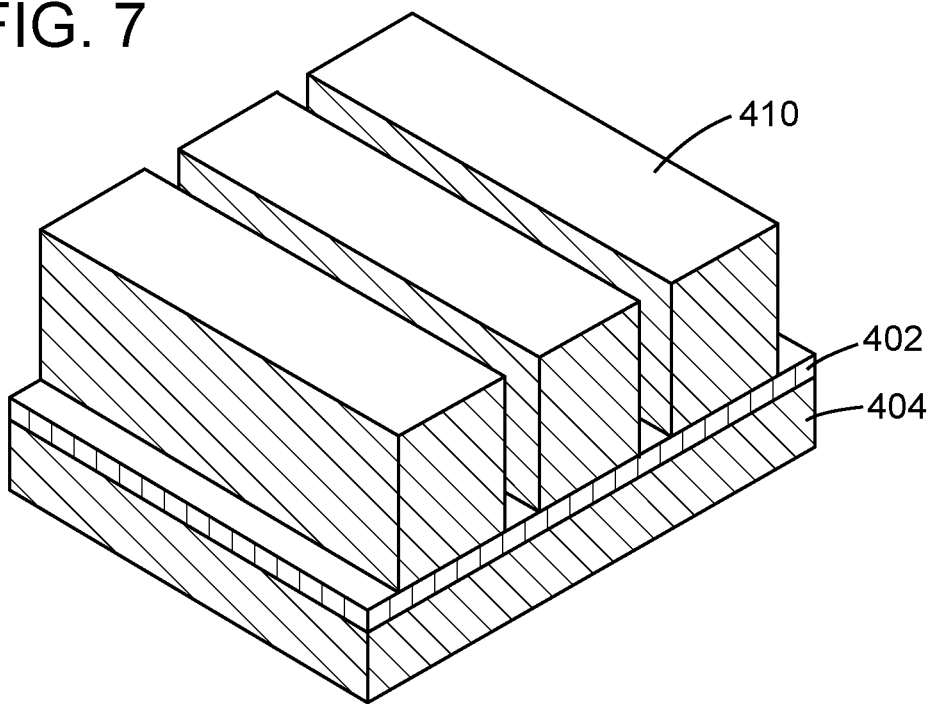
FIG. 7 shows an embodiment of a micro-scale thermal management device fabricated according to microfabrication techniques as described herein.
Figure 8:
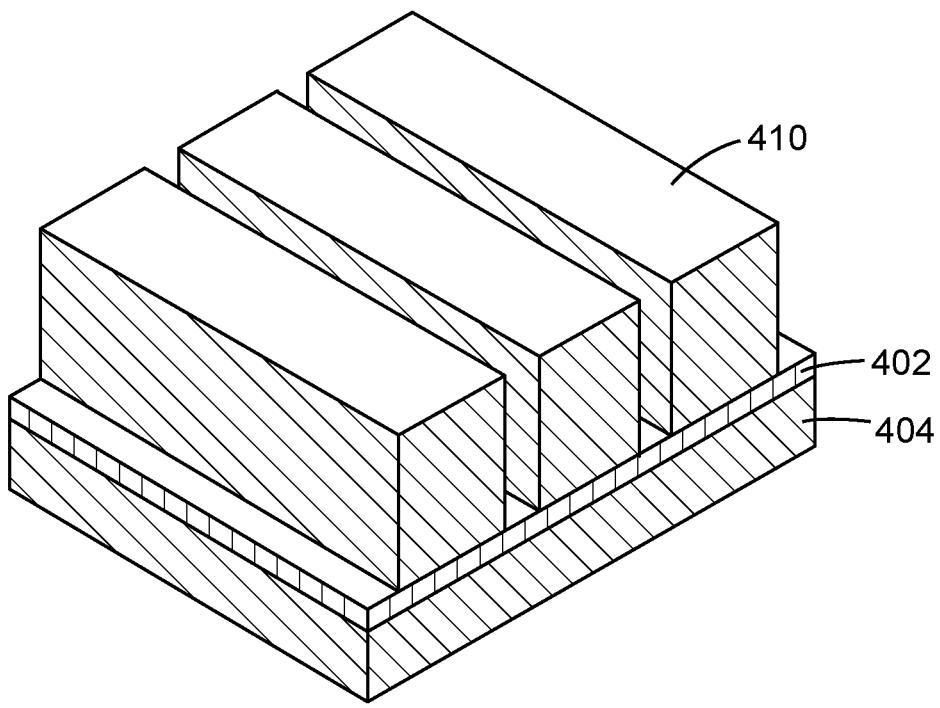
FIG. 8 shows an embodiment of a micro-scale thermal management device fabricated according to microfabrication techniques as described herein. The heat sinks in this embodiment are also referred to as "fins".

After patterning, etching, and application of the photoresist or photoresist layer, Cu heat sinks 410 can then be grown using ECD on the exposed Au seed layer 402 top to build the heat sinks 410, which can also be referred to as heat sink fins or plates (FIG. 4(e)). Finally, the wafer is put in $XeF_2$ reactor to remove the Si support mold (FIG. 4(e)). The resulting micro-scale thermal management device, which can also be referred to as a heat sink, has micro-scale features to maximize surface area with minimum vertical height, and very thin base to attain flexibility (FIG. 7). In an embodiment, the device according to FIG. 7 can have a heat sink base layer 404 of Cu, a seed layer 402 of Au, and heat sinks 410 made of deposited Cu. The deposited heat sinks 410 can be of any design that can be patterned into the hard mask and etched. The deposited heat sinks 410 can be fins or plates. FIG. 8 depicts an embodiment of a micro-scale thermal management device microfabricated according to the herein described techniques that exhibits heat sinks 410 in a "fin" structure.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

Unless defined otherwise, all technical and scientific terms used have the same meaning as commonly understood by one of ordinary skill in the art to which this disclosure belongs. Although any methods and materials similar or equivalent to those described can also be used in the practice or testing of the present disclosure, the preferred methods and materials are now described.

All publications and patents cited in this specification are incorporated by reference as if each individual publication or patent were specifically and individually indicated to be incorporated by reference and are incorporated by reference to disclose and describe the methods and/or materials in connection with which the publications are cited. The citation of any publication is for its disclosure prior to the filing date and should not be construed as an admission that the present disclosure is not entitled to antedate such publication by prior disclosure. Further, the dates of publication provided could differ from the actual publication dates that may need to be independently confirmed.

As will be apparent to those of skill in the art upon reading this disclosure, each of the individual embodiments described and illustrated has discrete components and features which may be readily separated from or combined with the features of any of the other several embodiments without departing from the scope or spirit of the present disclosure. Any recited method can be carried out in the order of events recited or in any other order logically possible.

Embodiments of the present disclosure will employ, unless otherwise indicated, techniques of molecular biology, microbiology, nanotechnology, organic chemistry, biochemistry, botany, which are within the skill of the art. Such techniques are explained fully in the literature.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Therefore, the following is claimed:

1. A method of fabricating a thermal management device, comprising:
   depositing a seed layer, using a seed layer depositing technique, on a side of a support base;
   growing a heat sink base layer on a side of the seed layer opposite the support base, using a heat sink base layer growth technique;
   depositing a hard mask on a side of the support base directly opposite that containing the seed and heat sink base layers, using one or more hard mask depositing techniques;
   patterning the hard mask with a photoresist mask and one or more patterning techniques;
   etching the patterned hard mask with an etching technique, wherein the etching creates trenches in the underlying support base, exposing the seed layer;
   removing the hard mask with a hard mask removal technique;
   depositing a layer of photoresist on the heat sink base layer on a side of the heat sink base layer opposite the seed layer;
   growing heat sinks using a heat sink growth technique on the exposed seed layer opposite the heat sink base layer;

removing the photoresist layer with a photoresist layer removal technique; and removing the support base with a support base removal technique.

2. The method of claim 1, wherein the support base comprises silicon.

3. The method of claim 1, wherein the seed layer is comprised of Au.

4. The method of claim 1, wherein the seed layer depositing technique is chemical vapor deposition or atomic layer deposition.

5. The method of claim 1, wherein the heat sink base layer is comprised of Cu and has a thickness of about 10 µm.

6. The method of claim 1, wherein the heat sink base layer growth technique is electrochemical disposition.

7. The method of claim 1, wherein the hard mask comprises a layer of Al deposited on the support base, and a layer of Cr deposited on the Al layer on a side of the Al layer opposite that of the support base.

8. The method of claim 7, wherein the Al layer has a thickness of about 300 nm and the Cr layer has a thickness of about 150 nm.

9. The method of claim 1, where the one or more hard mask depositing techniques are selected from the group consisting of atomic layer deposition, chemical vapor deposition, sputtering, evaporation, and sol-gelcoating.

10. The method of claim 1, wherein the one or more patterning techniques are selected from the group consisting of photolithography, the Bosch process, cryogenic etching, tradition non-reactive etching, and isotropic etching.

11. The method of claim 1, wherein the hard mask is removed with a solvent or chemical developing composition.

12. The method of claim 1, wherein the support base removal technique is selected from the group consisting of wet etching, deep reactive ion etching, the Bosch process, and cryogenic etching.

13. The method of claim 1, wherein the photoresist mask and photoresist layer comprise positive ECI 3027 photoresist.

14. The method of claim 1, wherein the etching technique is deep reactive ion etching.

15. The method of claim 1, wherein the heat sink growth technique is electrochemical deposition.

16. The method of claim 1, wherein removing the support base is performed in a XeF2 reactor.

* * * * *